United States Patent
Wang et al.

(10) Patent No.: US 9,345,161 B2
(45) Date of Patent: May 17, 2016

(54) FRONT PANEL OF BOARD, BOARD, AND ELECTRONIC APPARATUS

(71) Applicant: Huawei Technologies Co., Ltd., Shenzhen, Guangdong (CN)

(72) Inventors: Guangjing Wang, Shenzhen (CN); Yinzhong Tang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 210 days.

(21) Appl. No.: 13/649,691

(22) Filed: Oct. 11, 2012

(65) Prior Publication Data

US 2013/0033831 A1    Feb. 7, 2013

Related U.S. Application Data

(63) Continuation of application No. PCT/CN2011/072650, filed on Apr. 12, 2011.

(30) Foreign Application Priority Data

Apr. 12, 2010    (CN) .......................... 2010 1 0147319

(51) Int. Cl.
| | |
|---|---|
| *F16B 7/10* | (2006.01) |
| *H05K 5/00* | (2006.01) |
| *H05K 7/14* | (2006.01) |
| *G06F 1/18* | (2006.01) |

(52) U.S. Cl.
CPC .............. *H05K 7/1417* (2013.01); *G06F 1/185* (2013.01); *G06F 1/186* (2013.01); *H05K 7/1402* (2013.01); *Y10T 403/32* (2015.01)

(58) Field of Classification Search
USPC ....................... 361/727, 798; 292/105, 169.14
See application file for complete search history.

(56) References Cited

U.S. PATENT DOCUMENTS

| | | | | |
|---|---|---|---|---|
| 3,467,891 | A * | 9/1969 | Mogle ....................... | G06F 1/18 361/704 |
| 6,816,383 | B2 * | 11/2004 | Barringer et al. ............. | 361/759 |
| 2009/0231803 | A1 * | 9/2009 | Chang ...................... | 361/679.47 |

FOREIGN PATENT DOCUMENTS

| | | |
|---|---|---|
| CN | 2666091 A | 12/2004 |
| CN | 1735324 A | 2/2006 |

(Continued)

OTHER PUBLICATIONS

International Search Report dated Jul. 14, 2011 in connection with International Patent Application No. PCT/CN2011/072650.
Written Opinion of the Internationalk Searching Authority dated Jul. 14, 2011 in connection with International Patent Application No. PCT/CN2011/072650.

(Continued)

*Primary Examiner* — Tremesha S Willis
*Assistant Examiner* — Michael E Moats, Jr.

(57) ABSTRACT

The present invention provides a front panel of a board, a board, and an electronic apparatus. The front panel of the board includes a main body of the front panel, configured to fixedly connect to a circuit board on the board, and a fixing apparatus, where the fixing apparatus is fixedly disposed on the main body of the front panel, and is configured to fix the board in a shelf after the board is installed into the shelf. The fixing apparatus is fixedly disposed on the front panel of the board. After the board is installed into the shelf, the board may be securely fixed in the shelf through the fixing apparatus that is on the front panel of the board, so that a connector of the board keeps good contact with a connector of the shelf, thereby improving reliability of a connection between the board and the shelf.

18 Claims, 7 Drawing Sheets

(56) References Cited

FOREIGN PATENT DOCUMENTS

| | | |
|---|---|---|
| CN | 200992880 Y | 12/2007 |
| CN | 201064042 Y | 5/2008 |
| CN | 101431876 A | 5/2009 |
| CN | 101840256 A | 9/2010 |

OTHER PUBLICATIONS

Translation of Office Action dated Aug. 30, 2011 in connection with Chinese Patent Application No. 201010147319.9.

Translation of Office Action dated May 29, 2012 in connection with Chinese Patent Application No. 201010147319.9.

* cited by examiner

FRONT PANEL OF BOARD, BOARD, AND ELECTRONIC APPARATUS

CROSS-REFERENCE TO RELATED APPLICATIONS

This application is a continuation of International Application No. PCT/CN2011/072650, filed on Apr. 12, 2011, which claims priority to Chinese Patent Application No. 201010147319.9, filed on Apr. 12, 2010, both of which are hereby incorporated by reference in their entireties.

TECHNICAL FIELD

The embodiments of the present invention relate to the field of electronic technologies, and in particular, to a front panel of a board, a board, and an electronic apparatus.

BACKGROUND

A micro telecommunications computing architecture (micro telecommunications computing architecture, hereinafter referred to as MTCA) is an industrial standard that is applied to a communication device. A computing device based on the MTCA standard has the following advantages: A structure and a layout are compact, less energy is consumed, a smaller space is occupied, and extensibility, interoperability, and interchangeability are better. A shelf of the computing device that is MTCA-compliant is used for installing a board. The board generally includes a circuit board, a front panel that is fixed on the circuit board, and electronic components that are connected to a connector of the circuit board. According to a form factor, the board is categorized into a full-height board and a half-height board. The full-height board is directly inserted into an upper guide rail and a lower guide rail that are disposed in the shelf, and is electrically connected to the shelf through the connector; and the half-height board is installed into the shelf through a detachable board, where the detachable board has a guide rail in the middle of the detachable board, and needs to be disposed in the shelf.

In the prior art, generally, the board is installed into the shelf in the following manner: The full-height board is inserted into the upper guide rail and the lower guide rail that are disposed in the shelf, so that the full-height board is fixed in the shelf; furthermore, a raised hook that is disposed on an entrance of the guide rail collaborates with a locking splinter that is disposed on a front panel of the full-height board to fix the full-height board in the shelf. During installation of the half-height board, the detachable board is first disposed in the shelf, the middle of the detachable board is disposed with an upper support guide rail that corresponds to the upper guide rail and a lower support guide rail that corresponds to the lower guide rail, and structures of the upper support guide rail, the lower support guide rail, the upper guide rail, and the lower guide rail are all the same. Entrances of the guide rails are all disposed with a raised hook, so that the raised hook collaborates with a locking splinter that is disposed on a front panel of the half-height board to fix the half-height board in the shelf.

During implementation of the present invention, the inventor finds that a board in the prior art is not securely fixed, and an installed board is intended to swing, which causes poor contact between a connector of the board and a connector of a shelf. Therefore, in the prior art, reliability of a connection between the board and the shelf is poor.

SUMMARY

Embodiments of the present invention provide a front panel of a board, a board, and an electronic apparatus to solve a defect that since a board in the prior art is not securely fixed, a connector of the board is not well contacted with a connector of a shelf, thereby improving reliability of a connection between the board and the shelf.

An embodiment of the present invention provides a front panel of a board, which includes a main body of the front panel, configured to fixedly connect to a circuit board on the board, and further includes a fixing apparatus, where the fixing apparatus is fixedly disposed on the main body of the front panel, and is configured to fix the board in a shelf after the board is installed into the shelf.

An embodiment of the present invention provides a board, which includes a circuit board, and further includes the front panel as mentioned in the preceding, where the front panel of the board is fixedly disposed on the circuit board.

An embodiment of the present invention provides an electronic apparatus, which includes a shelf, and further includes the board as mentioned in the preceding, where the board is fixedly disposed in the shelf.

With the front panel of the board, board, and electronic apparatus according to the embodiments of the present invention, a fixing apparatus is fixedly disposed on the main body of the front panel. After the board is installed into the shelf, the board may be securely fixed in the shelf through the fixing apparatus that is on the front panel of the board, so that a connector of the board keeps good contact with a connector of the shelf, thereby improving reliability of a connection between the board and the shelf.

BRIEF DESCRIPTION OF THE DRAWINGS

To describe the technical solutions in the embodiments of the present invention or in the prior art clearly, the accompanying drawings required for describing the embodiments or the prior art are briefly introduced in the following. Apparently, the accompanying drawings in the following description are some embodiments of the present invention, and persons of ordinary skill in the art may also derive other drawings from these accompanying drawings without any creative effort.

DETAILED DESCRIPTION

To make the objectives, technical solutions, and advantages of the embodiments of the present invention clearer, the technical solutions in the embodiments of the present invention are described clearly and completely in the following with reference to the accompanying drawings in the embodiments of the present invention. Evidently, the embodiments are only a part rather than all of the embodiments of the present invention. Based on the embodiments of the present invention, all other embodiments obtained by persons of ordinary skill in the art without making any creative effort shall fall within the protection scope of the present invention.

Figure 1:
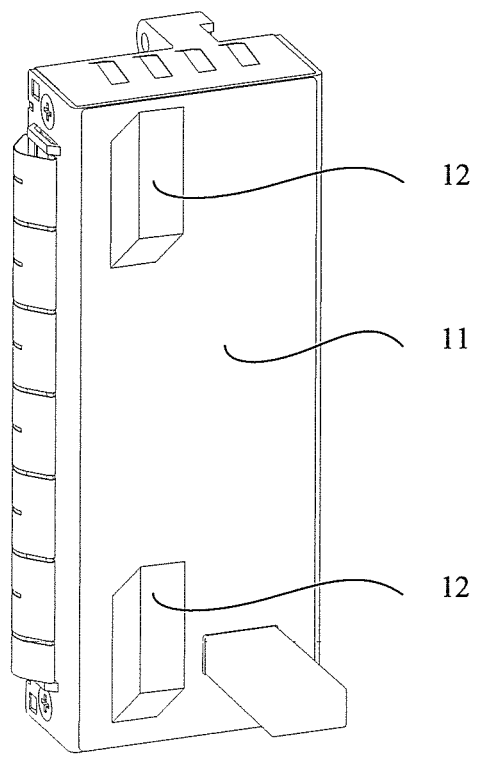
FIG. 1 is a schematic structural diagram of a front panel of a board according to a first embodiment of the present invention.

FIG. 1 is a schematic structural diagram of a front panel of a board according to a first embodiment of the present invention. As shown in FIG. 1, in this embodiment, a front panel of a board includes a main body of the front panel 11, configured to fixedly connect to a circuit board on the board, and further includes a fixing apparatus 12, where the fixing apparatus 12 is fixedly disposed on the main body of the front panel 11, and is configured to fix the board in a shelf after the board is installed into the shelf.

Specifically, in this embodiment, the main body of the front panel 11 in the front panel of the board is fixedly connected to the circuit board on the board, and the fixing apparatus 12 is fixedly disposed on the main body of the front panel 11. After a board that is installed with the front panel of the board in this embodiment is installed into the shelf, in order to securely fix the board in the shelf and ensure a good connection between a connector of the board and a connector that is correspondingly disposed in the shelf, in this embodiment, the fixing apparatus 12 in the front panel of the board is fixedly connected to the shelf, so that the board may be securely fixed in the shelf through the fixing apparatus 12. At this time, the fixing apparatus 12 puts pressure on the board, so that the connector of the board is well connected to the connector in the shelf. Furthermore, the fixing apparatus 12 fixes the board in the shelf at the same time. Even though the shelf undergoes vibration due to an external factor, the board can still be securely fixed in the shelf by the fixing apparatus 12, thereby reducing an impact caused by the vibration of the shelf on the board. In this embodiment, the fixing apparatus 12 may be securely connected to the shelf through connection elements such as a buckle and a screw. In this embodiment, a manner for connecting the fixing apparatus 12 of the front panel of the board to the shelf is not limited. In addition, in this embodiment, the fixing apparatus 12 may be fixedly connected to the shelf by extending the main body 11 of the front panel in rotating or stretching manner.

With the front panel of the board in this embodiment, the fixing apparatus is fixedly disposed on the main body of the front panel. After the board is installed into the shelf, the board may be securely fixed in the shelf through the fixing apparatus that is on the front panel of the board, so that the connector of the board keeps good contact with the connector in the shelf, thereby improving reliability of a connection between the board and the shelf.

Based on the preceding technical solution, optionally, in this embodiment, the front panel of the board includes two fixing apparatuses 12. One fixing apparatus 12 is fixedly disposed at one end of the main body of the front panel 11, and the other fixing apparatus 12 is fixedly disposed at the other end of the main body of the front panel 11.

Specifically, in this embodiment, in a process that the front panel of the board is actually used, the front panel of the board in this embodiment may be applied to a full-height board or a half-height board. After a full-height board is installed into the shelf, both two ends of the full-height board need to be fixed through the fixing apparatus 12, where the two ends of the full-height board are close to the shelf. In the same way, after a half-height board is installed into the shelf, the half-height board may be installed in an upper part of the shelf, and may also be installed in a lower part of the shelf. Therefore, both two ends of the half-height board need to be disposed with the fixing apparatus 12. Therefore, in this embodiment, the front panel of the board is disposed with two fixing apparatuses 12, and the two fixing apparatuses 12 are fixedly disposed at two ends of the main body of the front panel 11 respectively, so that the front panel of the board in this embodiment may be applied to a full-height board or a half-height board to securely fix the full-height board or the half-height board to the shelf conveniently.

With the front panel of the board in this embodiment, a fixing apparatus is disposed respectively at two ends of the main body of the front panel, so that the front panel of the board in this embodiment can securely fix a full-height board or a half-height board to the shelf conveniently. In this way, an application scope of the front panel of the board in this embodiment is larger, and furthermore, the board is more securely fixed to the shelf through two fixing apparatuses, which is more useful to improve reliability of a connection between the board and the shelf.

Figure 2:
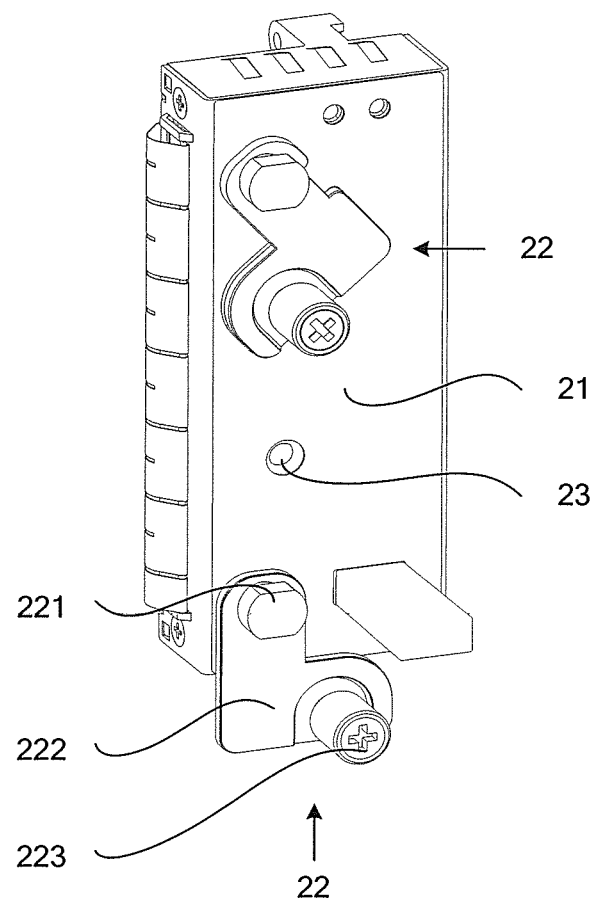
FIG. 2 is a schematic structural diagram of a front panel of a board according to a second embodiment of the present invention.

FIG. 2 is a schematic structural diagram of a front panel of a board according to a second embodiment of the present invention. As shown in FIG. 2, in this embodiment, the front panel of the board differs from the front panel of the board in the first embodiment in that: In this embodiment, a fixing apparatus 22 includes a fixing axis 221, a flipping plate 222, and a screw 223. The flipping plate 222 has a first locating hole (which is not shown in the figure) and a second locating hole (which is not shown in the figure); the fixing axis 221 passes through the first locating hole and is fixedly disposed on a main body of the front panel 21; and the screw 223 passes through the second locating hole and is disposed in the second locating hole, and is configured to connect to a screwed hole that is on a shelf, so as to fix the board on the shelf.

Specifically, in this embodiment, the fixing apparatus 22 includes the fixing axis 221, the flipping plate 222, and the screw 223. The flipping plate 222 can drive the screw 223 to rotate around the fixing axis 221. After a board that is installed with the front panel of the board in this embodiment is installed into the shelf, the screw 223 is extended from the main body of the front panel 21 by rotating the flipping plate 222, and then, the screw 223 is aligned with the screwed hole that is on the shelf, and the screw 223 is screwed into the screwed hole. At this time, the screw 223 is securely fixed in the screwed hole that is on the shelf, so that the board can be securely fixed in the shelf by the fixing apparatus 22 of the front panel of the board in this embodiment. In the same way, with the front panel of the board in this embodiment, the fixing apparatus 22 may be fixedly disposed at two ends of the main body of the front panel 21 respectively, so that the front panel of the board in this embodiment can be conveniently applied to a full-height board or a half-height board.

With the front panel of the board in this embodiment, a flipping plate that has a screw is installed on the main body of the front panel through the fixing axis, so that the screw can rotate with the flipping plate around the fixing axis. When the board needs to be fixed, the screw is connected to a screwed hole in the shelf, so that the board may be securely fixed in the shelf conveniently. In this way, a connector of the board keeps good contact with a connector of the shelf, thereby improving reliability of a connection between the board and the shelf. In addition, the fixing apparatus is connected to the screwed hole in the shelf through the screw, so that the fixing apparatus is fixedly connected to the shelf. Therefore, the front panel of the board in this embodiment is used more conveniently, thereby improving operation performance of the front panel of the board in this embodiment.

Based on the preceding technical solution, optionally, in this embodiment, the main body of the front panel 21 has a limiter hole 23, where the limiter hole 23 is configured to perform limiting by inserting the screw 223 into the limiter hole 23 when the screw 223 is not connected to the shelf.

Specifically, with the front panel of the board in this embodiment, the main body of the front panel 21 has the limiter hole 23, and limiting and fixing are performed, through the limiter hole 23, on the screw 223 that is not connected to the shelf. To be specific, due to a use environment limitation, when the board can be fixedly connected to the shelf only through one fixing apparatus 22 on the main body of the front panel 21, a screw 223 in the other fixing apparatus 22 that is not used may be moved to a position of the limiter hole 23 by rotating the flipping plate 222, and then the screw 223 is inserted into the limiter hole 23, so that the screw 223 is spaced and fixed through the limiter hole 23. In this embodiment, the limiter hole 23 may be a smooth hole, where the screw 223 is inserted into the smooth hole, so as to space and fix the screw 223. In addition, in this embodiment, the limiter hole 23 may also be a screwed hole, where the screw 223 may be screwed into the limiter hole 23, so that the screw 223 can be securely fixed in the limiter hole 23.

With the front panel of the board in this embodiment, the limiter hole is on the main body of the front panel, so that the screw that is not connected to the shelf may be inserted into the limiter hole for limiting and fixing. In this way, a fixing apparatus in an idle state may be spaced and fixed, which avoids casual swinging of the fixing apparatus in the idle state.

Figure 3:
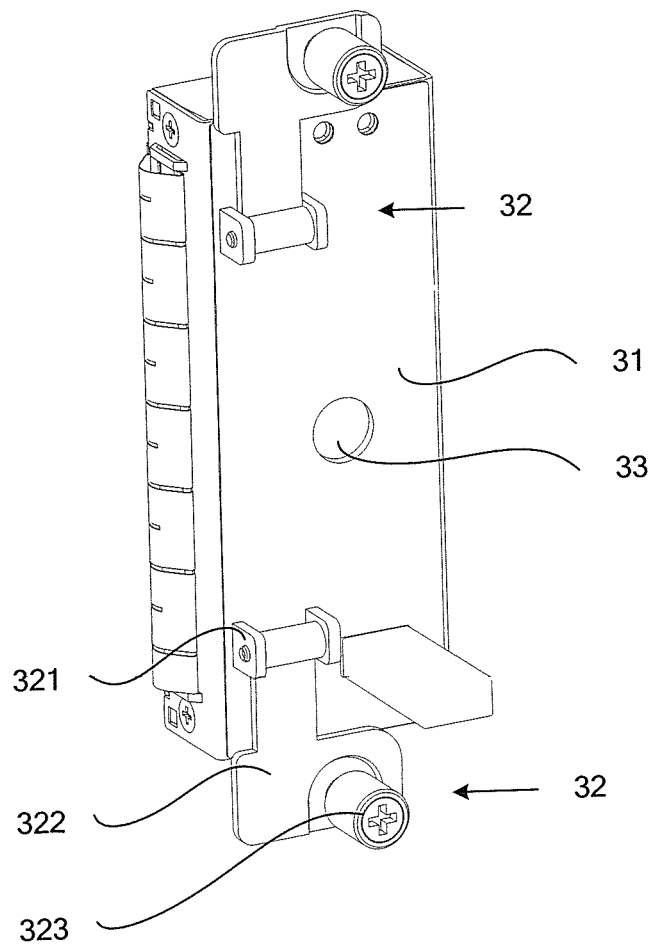
FIG. 3 is a schematic structural diagram of a front panel of a board according to a third embodiment of the present invention.

FIG. 3 is a schematic structural diagram of a front panel of a board according to a third embodiment of the present invention. As shown in FIG. 3, in this embodiment, the front panel of the board differs from the front panel of the board in the first embodiment in that: In this embodiment, a fixing apparatus 32 includes a fixing base 321, a flipping plate 322, and a screw 323. The fixing base 321 is fixedly disposed on a main body of the front panel 31; one end of the flipping plate 322 is articulated with the fixing base 321, and the other end of the flipping plate 322 has a locating hole (which is not shown in the figure); and the screw 323 passes through the locating hole and is disposed in the locating hole, and is configured to connect to a screwed hole that is on a shelf, so as to fix the board on the shelf.

Specifically, in this embodiment, the fixing apparatus 32 includes the fixing base 321, the flipping plate 322, and the screw 323. The fixing base 321 is fixedly disposed on the main body of the front panel 31. One end of the flipping plate 322 is articulated with the fixing base 321, and the other end of the flipping plate 322 has the screw 323, so that the flipping plate 322 can drive the screw 323 to rotate around the fixing base 321. After a board that is installed with the front panel of the board in this embodiment is installed into the shelf, the screw 323 is extended from the main body of the front panel 31 by rotating the flipping plate 322, and then, the screw 323 is aligned with the screwed hole that is on the shelf, and the screw 323 is screwed into the screwed hole. At this time, the screw 323 is securely fixed in the screwed hole that is on the shelf, so that the board can be securely fixed in the shelf by the fixing apparatus 32 of the front panel of the board in this embodiment. In order to articulate the fixing base 321 with the flipping plate 322 conveniently, two through holes may be on the fixing base 321, and the flipping plate 322 is articulated in the through holes through a rotating axis. In the same way, with the front panel of the board in this embodiment, the fixing apparatus 32 may be fixedly disposed at two ends of the main body of the front panel 31 respectively, so that the front panel of the board in this embodiment can be conveniently applied to a full-height board or a half-height board.

With the front panel of the board in this embodiment, a flipping plate that has a screw is installed on the main body of the front panel through the fixing base, so that the screw can rotate with the flipping plate around the fixing base. When the board needs to be fixed, the screw is connected to a screwed hole in the shelf, so that the board may be securely fixed in the shelf conveniently. In this way, a connector of the board keeps good contact with a connector of the shelf, thereby improving reliability of a connection between the board and the shelf. In addition, the fixing apparatus is connected to the screwed hole in the shelf through the screw, so that the fixing apparatus is fixedly connected to the shelf. Therefore, the front panel of the board in this embodiment is used more conveniently, thereby improving operation performance of the front panel of the board in this embodiment.

Based on the preceding technical solution, optionally, in this embodiment, the main body of the front panel 31 has a limiter hole 33, where the limiter hole 33 is configured to perform limiting by inserting the screw 323 into the limiter hole 33 when the screw 323 is not connected to the shelf.

Specifically, with the front panel of the board in this embodiment, the main body of the front panel 31 has the limiter hole 33, and limiting and fixing are performed, through the limiter hole 33, on the screw 323 that is not connected to the shelf. A specific process of using the limiter hole 33 may be made reference to the description about the limiter hole in the second front panel of the board embodiment of the present invention, which is not detailed here.

With the front panel of the board in this embodiment, the limiter hole is on the main body of the front panel, so that the screw that is not connected to the shelf may be inserted into the limiter hole for limiting and fixing. In this way, a fixing apparatus in an idle state may be spaced and fixed, which avoids casual swinging of the fixing apparatus in the idle state.

Figure 4:
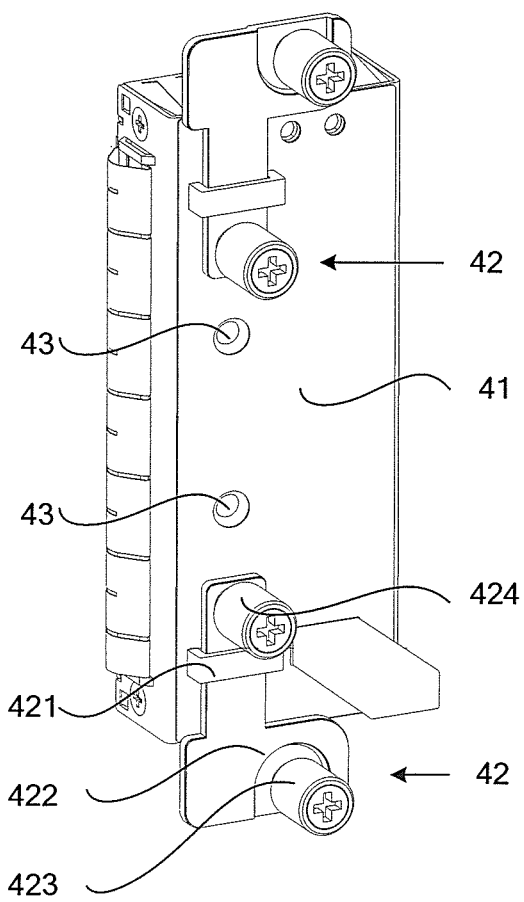
FIG. 4 is a schematic structural diagram of a front panel of a board according to a fourth embodiment of the present invention.

FIG. 4 is a schematic structural diagram of a front panel of a board according to a fourth embodiment of the present invention. As shown in FIG. 4, in this embodiment, the front panel of the board differs from the front panel of the board in the first embodiment in that: In this embodiment, a fixing apparatus 42 includes a sliding base 421, a sliding plate 422, and a screw 423. The sliding base 421 is fixedly disposed on a main body of the front panel 41; the sliding plate 422 is disposed on the sliding base 421 in a sliding way, where an end of the sliding plate 422 is disposed with a locating apparatus 424, where the end of the sliding plate 422 is close to a center of the main body of the front panel 41, and the other end of the sliding plate 422 has a locating hole (which is not shown in the figure); and the screw 423 passes through the locating hole and is disposed in the locating hole, and is configured to connect to a screwed hole that is on a shelf, so as to fix the board on the shelf.

Specifically, in this embodiment, the fixing apparatus 42 includes the sliding base 421, the sliding plate 422, and the screw 423. The sliding base 421 is fixedly disposed on the main body of the front panel 41, and the sliding plate 422 can drive the screw 423 to slide against the sliding base 421. To prevent the sliding plate 422 from sliding out of the sliding base 421, in this embodiment, the end of the sliding plate 422 is further disposed with the locating apparatus 421, where the end of the sliding plate 422 is close to the center of the main body of the front panel 41. After a board that is installed with the front panel of the board in this embodiment is installed into the shelf, the screw 423 is extended from the main body of the front panel 41 by moving the sliding plate 422, and then, the screw 423 is aligned with the screwed hole that is on the shelf, and the screw 423 is screwed into the screwed hole. At this time, the screw 423 is securely fixed in the screwed hole that is on the shelf, so that the board can be securely fixed in the shelf by the fixing apparatus 42 of the front panel of the board in this embodiment. In this embodiment, a cross-section of the sliding base 421 may be a U shape. After the sliding base 421 is fixedly disposed on the main body of the front panel 41, the sliding base 421 forms a sliding space with the main body of the front panel 41. The sliding plate 422 is disposed in the sliding space in a sliding way, so that the sliding plate 422 can slide against the sliding base 421. In the same way, with the front panel of the board in this embodiment, the fixing apparatus 42 may be fixedly disposed at two ends of the main body of the front panel 41 respectively, so that the front panel of the board in this embodiment can be conveniently applied to a full-height board or a half-height board.

With the front panel of the board in this embodiment, a sliding plate that has a screw is installed on the main body of the front panel through the sliding plate, so that the screw can slide with the slide plate against the sliding base. When the board needs to be fixed, the screw is connected to a crewed hole in the shelf, so that the board may be securely fixed in the shelf conveniently. In this way, a connector of the board keeps good contact with a connector of the shelf, thereby improving reliability of a connection between the board and the shelf. In addition, the fixing apparatus is connected to the screwed hole in the shelf through the screw, so that the fixing apparatus is fixedly connected to the shelf. Therefore, the front panel of the board in this embodiment is used more conveniently, thereby improving operation performance of the front panel of the board in this embodiment.

Based on the preceding technical solution, optionally, in this embodiment, the locating apparatus 424 is a locating screw, where the locating screw passes through and is disposed in a through hole (which is not shown in the figure) that is on the sliding plate 422. The main body of the front panel 41 has a limiter hole 43, where the limiter hole 43 is configured to perform limiting by inserting the locating screw into the limiter hole 43 when the screw is not connected to the shelf.

Specifically, the locating apparatus 424 in this embodiment is a locating screw, and the locating screw prevents the sliding plate 422 from sliding out of the sliding base 421 when the sliding plate 422 slides against the sliding base 421. In addition, with the front panel of the board in this embodiment, the limiter hole 43 is on the main body of the front panel 41. When the screw 423 is not connected to the shelf, by moving the sliding plate 422, the screw 423 is retracted to an area where the main body of the front panel 41 is located, and then, the locating screw is inserted into the limiter hole 43 for limiting and fixing. A specific process of using of the limiter hole 43 may be made reference to the description about the limiter hole in the second front panel of the board embodiment of the present invention, which is not detailed here.

With the front panel of the board in this embodiment, the locating apparatus is a locating screw, and the locating screw and the sliding base collaboratively limit a course of the sliding plate, thereby preventing the sliding plate from sliding out of the sliding base. In addition, the limiter hole is on the main body of the front panel, so that the screw that is not connected to the shelf may be inserted into the limiter hole for limiting and fixing, which avoids casual swinging of a fixing apparatus in an idle state.

With the front panel of the board in this embodiment, in the second front panel of the board embodiment to the fourth front panel of the board embodiment, any two fixing apparatuses may also be selected and installed on the main body of the front panel to form a front panel of a board in the present invention.

Figure 5:
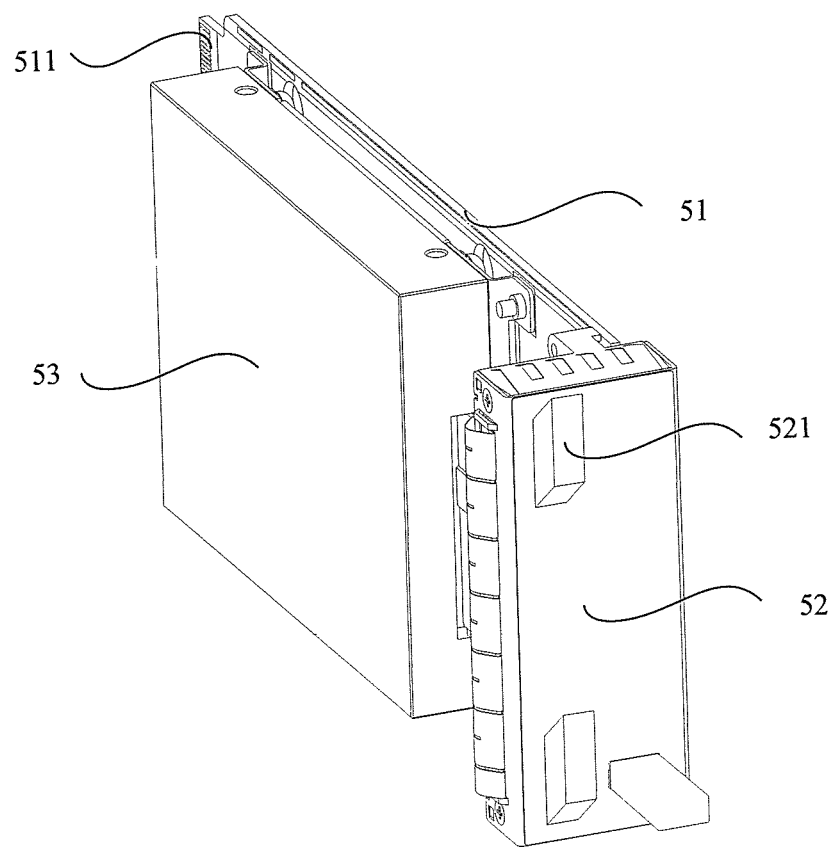
FIG. 5 is a schematic structural diagram of a board according to an embodiment of the present invention.

FIG. 5 is a schematic structural diagram of a board according to an embodiment of the present invention. As shown in FIG. 5, in this embodiment, the board includes a circuit board 51, and further includes a front panel of the board 52, where the front panel of the board 52 is fixedly disposed on the circuit board 51. In this embodiment, the front panel of the board 52 may adopt a front panel of a board in the front panel of board embodiment of the present invention.

Specifically, in this embodiment, the circuit board 51 on the board may be installed with an electronic element 53. The electronic element 53 is connected to a connector 511 of the circuit board 51, so that the electronic element 53 may perform data transmission and processing after the board in this embodiment is connected to a connector of a shelf. In this embodiment, the circuit board 51 of the board may be further fixedly disposed with a front panel of the board 52. After the board in this embodiment is installed into the shelf, the board may be securely fixed in the shelf through a fixing apparatus 521 in the front panel of the board 52. A specific structure of the front panel of the board 52 in this embodiment may be made reference to the description of the front panel of the board embodiment and the accompanying drawings 1 to 4, which is not detailed here. In addition, a specific representing entity of the board in this embodiment may be a full-height board or a half-height board.

With the board in this embodiment, the fixing apparatus is fixedly disposed on the front panel of the board. After the board is installed into the shelf, the board may be securely fixed in the shelf through the fixing apparatus that is on the front panel of the board, so that a connector of the board keeps good contact with a connector of the shelf, thereby improving reliability of a connection between the board and the shelf.

Figure 6:
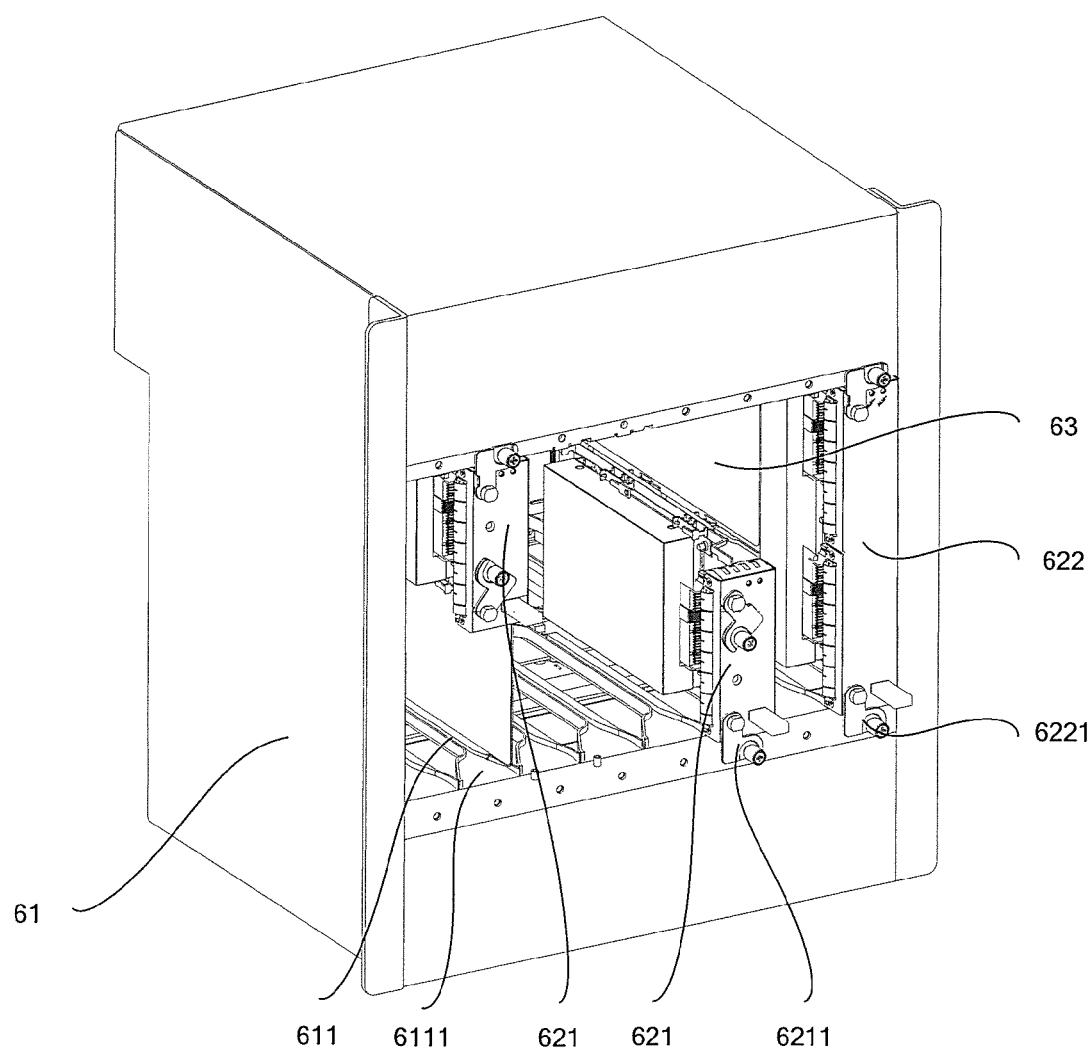
FIG. 6 is a schematic structural diagram of an electronic apparatus according to an embodiment of the present invention.
Figure 7:
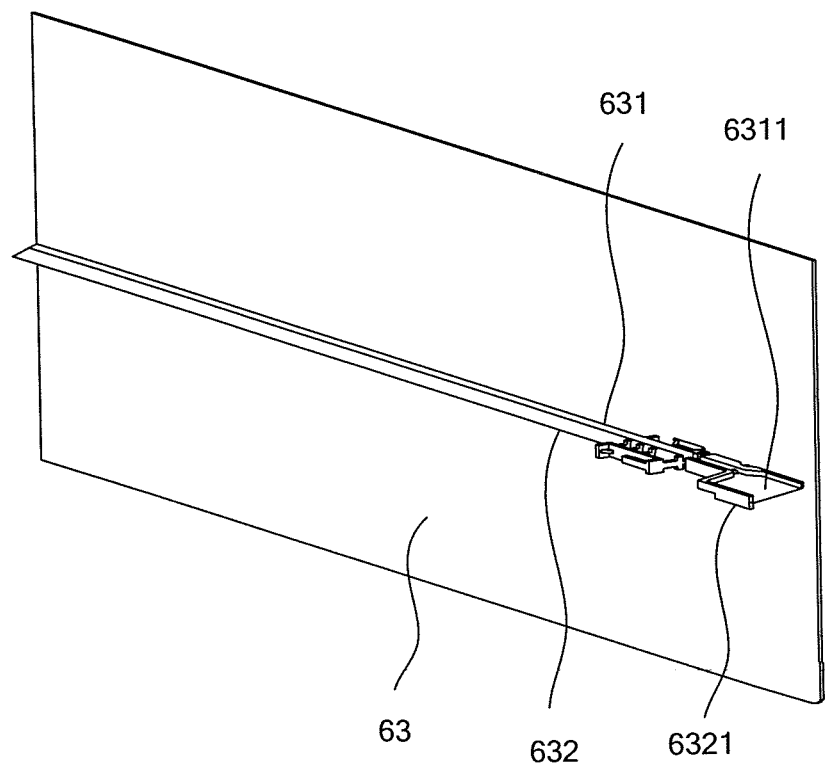
FIG. 7 is a schematic structural diagram of a detachable board in an electronic apparatus according to an embodiment of the present invention.

FIG. 6 is a schematic structural diagram of an electronic apparatus according to an embodiment of the present invention. FIG. 7 is a schematic structural diagram of a detachable board in an electronic apparatus according to an embodiment of the present invention. As shown in FIG. 6 and FIG. 7, the electronic apparatus in this embodiment includes a shelf 61, and further includes a board, where the board is fixedly disposed in the shelf. The board in this embodiment may adopt a board in the board embodiment of the present invention. In addition, the board in this embodiment may be categorized into a full-height board 622 and a half-height board 621.

Specifically, the shelf 61 in the electronic apparatus in this embodiment is installed with the full-height board 622 and/or the half-height board 621. The full-height board 622 may be securely fixed in the shelf 61 through a fixing apparatus 6221 that is on a front panel of the full-height board 622. In the same way, the half-height board 621 may also be securely fixed in the shelf 61 through a fixing apparatus 6211 that is on a front panel of the half-height board 621. When the half-height board 621 needs to be installed into the shelf 61, the electronic apparatus in this embodiment may further include a detachable board 63, and the half-height board 621 is stalled into the shelf 61 through the detachable board 63. In addition, a specific structure of the board in this embodiment may be made reference to the description of the board embodiment and the accompanying drawing 5, which is not detailed here.

With the electronic apparatus in this embodiment, a fixing apparatus is fixedly disposed on the front panel of the board. After the board is installed into the shelf, the board may be securely fixed in the shelf through the fixing apparatus that is on the front panel of the board, so that a connector of the board keeps good contact with a connector of the shelf, thereby improving reliability of a connection between the board and the shelf.

Based on the preceding technical solution, optionally, the shelf 61 in this embodiment is disposed with an upper guide rail (which is not shown in the figure) and a lower guide rail 611, and the detachable board 63 is disposed with an upper support guide rail 631 and a lower support guide rail 632. The upper support guide rail 631 corresponds to the upper guide rail, and the lower support guide rail 632 corresponds to the lower guide rail 611. Furthermore, an entrance of the upper guide rail in this embodiment may be a smooth guide rail and has a horn-shaped structure, and an entrance 6111 of the lower guide rail 611 is a smooth guide rail and has a horn-shaped structure. An entrance 6311 of the upper support guide rail 631 is a smooth guide rail and has a horn-shaped structure, and an entrance 6321 of the lower support guide rail 632 is a smooth guide rail and has a horn-shaped structure.

Specifically, the electronic apparatus in this embodiment fixes, through the fixing apparatus that is on the front panel of the board, the board that is installed into the shelf. Therefore, no hook needs to be additionally disposed on an entrance of each guide rail. In addition, the entrance of the upper guide rail and the entrance 6111 of the lower guide rail 611 are set to smooth guide rails with a horn-shaped structure. In the same way, the entrance 6311 of the upper support guide rail 631 and the entrance 6321 of the lower support guide rail 632 are set to smooth guide rails with a horn-shaped structure. In this way, during installation of the board into the shelf 61, a user may easily and conveniently insert the board into the guide rail.

With the electronic apparatus in this embodiment, the entrance of the upper guide rail and the entrance of the lower guide rail in the shelf are set to smooth slots with a horn-shaped structure, and the entrance of the upper support guide rail and the entrance of the lower support guide rail on a main body of a corresponding detachable board are set to smooth slots with a horn-shaped structure. In this way, a user conveniently inserts the half-height board into the guide rail, which facilitates an installation process of the half-height board.

It should be noted that the preceding embodiments are only used for describing the technical solutions of the present invention, but are not intended to limit the present invention. Although the present invention has been described in detail with reference to the preceding embodiments, those skilled in the art should understand that various modifications to the technical solution described in each preceding embodiment or equivalent replacements for parts of technical features in the technical solution may still be made, however, these modifications or equivalent replacements do not make the essence of the corresponding technical solution depart from the spirit and scope of the technical solution in each embodiment of the present invention.

What is claimed is:

1. A front panel for a board, the front panel comprising:
   a main body configured to connect to a circuit board on the board;
   a fixing apparatus connected to the main body, the fixing apparatus including a coupling mechanism configured, when the fixing apparatus is moved to a first position, to couple to an aperture disposed in the shelf so as to fix the board in the shelf after the board is installed into the shelf and, when moved to a second position, to couple to a limiter hole disposed in the main body, the limiter hole configured to limit movement of the fixing apparatus;
   wherein the front panel comprises a first fixing apparatus and a second fixing apparatus, wherein the first fixing apparatus is proximate one end of the main body and the second fixing apparatus is proximate another end of the main body; and
   wherein the fixing apparatus comprises a fixing axis and a flipping plate, and the coupling mechanism comprises a screw, wherein the flipping plate has a first locating hole and a second locating hole; the fixing axis passes through the first locating hole and is connected to the main body of the front panel such that the flipping plate pivots on the fixing axis; and the screw passes through the second locating hole and is disposed in the second locating hole, and is configured to connect to the aperture in the shelf when the fixing plate is pivoted to the first position.

2. The front panel according to claim 1, wherein the board is a full-height board, and the first fixing apparatus and second fixing apparatus are configured to connect with an upper body of the shelf and a bottom body of the shelf, respectively.

3. The front panel according to claim 1, wherein the board is a half-height board, and one of the first fixing apparatus and the second fixing apparatus is configured to fix with an upper body of the shelf or a bottom body of the shelf according to an installing position of the board.

4. The front panel according to claim 1, wherein the limiter hole is configured to perform limiting by inserting the screw into the limiter hole when the screw is not inserted into the aperture and connected to the shelf.

5. A board, comprising:
   a circuit board;
   a front panel configured to fixedly connect to the circuit board, and further comprising a fixing apparatus, wherein the fixing apparatus is connected to a main body of the front panel, the fixing apparatus including a coupling mechanism configured, when the fixing apparatus is moved to a first position, to couple to an aperture disposed in a shelf so as to fix the board in the shelf after the board is installed into the shelf and, when moved to a second position, to couple to a limiter hole disposed in the main body, the limiter hole configured to limit movement of the fixing apparatus;
   wherein the front panel of the board comprises a first fixing apparatus and a second fixing apparatus, wherein the first fixing apparatus proximate one end of the main body, and the second fixing apparatus is proximate another end of the main body;
   wherein the fixing apparatus comprises a fixing axis and a flipping plate, and the coupling mechanism comprises a screw, wherein the flipping plate has a first locating hole and a second locating hole; the fixing axis passes through the first locating hole and is connected to the main body of the front panel such that the flipping plate pivots on the fixing axis; and the screw passes through the second locating hole and is disposed in the second locating hole, and is configured to connect to the aperture in the shelf when the fixing plate is pivoted to the first position, and
   wherein the limiter hole is configured to perform limiting by inserting the screw into the limiter hole when the screw is not inserted into the aperture and connected to the shelf.

6. The board according to claim 5, wherein the board is a full-height board, and the first fixing apparatus and second fixing apparatus are configured to connect with an upper body of the shelf and a bottom body of the shelf, respectively.

7. The board according to claim 5, wherein the board is a half-height board, and one of the first fixing apparatus and the second fixing apparatus is configured to fix with an upper body of the shelf or a bottom body of the shelf according to an installing position of the board.

8. An electronic apparatus, comprising:
a shelf;
a board coupled to the shelf;
wherein the board comprises a circuit board and a front panel, the front panel configured to connect to the circuit board, the board further comprising a fixing apparatus, wherein the fixing apparatus is connected to a main body of the front panel, the fixing apparatus including a coupling mechanism configured, when the fixing apparatus is moved to a first position, to couple to an aperture disposed in the shelf so as to fix the board in the shelf after the board is installed into the shelf and, when moved to a second position, to couple to a limiter hole disposed in the main body, the limiter hole configured to limit movement of the fixing apparatus; and
wherein the front panel comprises a first fixing apparatus and a second fixing apparatus, wherein the first fixing apparatus is proximate one end of the main body and the second fixing apparatus is proximate another end of the main body;
wherein the fixing apparatus comprises a fixing axis and a flipping plate, and the coupling mechanism comprises a screw, wherein the flipping plate has a first locating hole and a second locating hole; the fixing axis passes through the first locating hole and is connected to the main body of the front panel such that the flipping plate pivots on the fixing axis; and the screw passes through the second locating hole and is disposed in the second locating hole, and is configured to connect to the aperture in the shelf when the fixing plate is pivoted to the first position, and
wherein the limiter hole is configured to perform limiting by inserting the screw into the limiter hole when the screw is not inserted into the aperture and connected to the shelf.

9. The electronic apparatus according to claim 8, wherein the board is a full-height board, and the first fixing apparatus and second fixing apparatus are configured to connect with an upper body of the shelf and a bottom body of the shelf, respectively.

10. The electronic apparatus according to claim 8, wherein the board is a half-height board, and one of the first fixing apparatus and the second fixing-apparatus is configured to fix with an upper body of the shelf or a bottom body of the shelf according to an installing position of the board.

11. A front panel for a board, the front panel comprising:
a main body configured to connect to a circuit board on the board;
a fixing apparatus connected to the main body, the fixing apparatus including a coupling mechanism configured, when the fixing apparatus is moved to a first position, to couple to an aperture disposed in the shelf so as to fix the board in the shelf after the board is installed into the shelf and, when moved to a second position, to couple to a limiter hole disposed in the main body, the limiter hole configured to limit movement of the fixing apparatus;
wherein the front panel comprises a first fixing apparatus and a second fixing apparatus, wherein the first fixing apparatus is proximate one end of the main body and the second fixing apparatus is proximate another end of the main body; and
wherein the fixing apparatus comprises a fixing base and a flipping plate, and the coupling mechanism comprises a screw, wherein the fixing base is connected to the main body of the front panel; the flipping plate is articulated with the fixing base proximate a first end of the flipping plate, and the flipping plate has a limiter hole proximate a second end of the flipping plate; and the screw passes through the limiter hole in the flipping plate and is disposed in the limiter hole in the flipping plate, and is configured to connect to the aperture in the shelf when the fixing plate is moved to the first position.

12. The front panel according to claim 4, wherein the limiter hole disposed in the main body is configured to perform limiting by inserting the screw into the limiter hole disposed in the main body when the screw is not inserted in the aperture and connected to the shelf.

13. A front panel for a board, the front panel comprising:
a main body configured to connect to a circuit board on the board;
a fixing apparatus connected to the main body, the fixing apparatus including a coupling mechanism configured, when the fixing apparatus is moved to a first position, to couple to an aperture disposed in the shelf so as to fix the board in the shelf after the board is installed into the shelf and, when moved to a second position, to couple to a limiter hole disposed in the main body, the limiter hole configured to limit movement of the fixing apparatus;
wherein the front panel comprises a first fixing apparatus and a second fixing apparatus, wherein the first fixing apparatus is proximate one end of the main body and the second fixing apparatus is proximate another end of the main body; and
wherein the fixing apparatus comprises a sliding base and a sliding plate, and the coupling mechanism comprises a screw, wherein the sliding base is connected to the main body of the front panel such that the sliding plate is movable in a space between the sliding base and the sliding plate; the sliding plate including a locating apparatus proximate a first end of the sliding plate and a limiter hole proximate a second end of the sliding plate; and the screw passes through the limiter hole in the sliding plate and is disposed in the limiter hole in the sliding plate, and is configured to connect to the aperture in the shelf when the sliding plate is moved to the first position.

14. The front panel according to claim 13, wherein the locating apparatus is a locating screw, wherein the locating screw passes through and is disposed in a through hole that is on the sliding plate; wherein the limiter hole disposed in the main body is configured to perform limiting by inserting the locating screw into the limiter hole disposed in the main body when the locating screw is not inserted into the aperture and connected to the shelf.

15. A board, comprising:
a circuit board;
a front panel configured to fixedly connect to the circuit board, and further comprising a fixing apparatus, wherein the fixing apparatus is connected to a main body of the front panel, the fixing apparatus including a coupling mechanism configured, when the fixing apparatus is moved to a first position, to couple to an aperture disposed in the shelf so as to fix the board in the shelf after the board is installed into the shelf and, when moved to a second position, to couple to a limiter hole disposed in the main body, the limiter hole configured to limit movement of the fixing apparatus;
wherein the front panel of the board comprises a first fixing apparatus and a second fixing apparatus, wherein the first fixing apparatus proximate one end of the main body, and the second fixing apparatus is proximate another end of the main body;

wherein the fixing apparatus comprises a fixing base and a flipping plate, and the coupling mechanism comprises a screw, wherein the fixing base is connected to the main body of the front panel; the flipping plate is articulated with the fixing base proximate a first end of the flipping plate, and the flipping plate has a limiter hole proximate a second end of the flipping plate; and the screw passes through the limiter hole in the flipping plate and is disposed in the limiter hole in the flipping plate, and is configured to connect to the aperture in the shelf when the fixing plate is moved to the first position, and wherein the limiter hole disposed in the main body is configured to perform limiting by inserting the screw into the limiter hole disposed in the main body when the screw is not inserted in the aperture and connected to the shelf.

16. A board, comprising:
a circuit board;
a front panel configured to fixedly connect to the circuit board, and further comprising a fixing apparatus, wherein the fixing apparatus is connected to a main body of the front panel, the fixing apparatus including a coupling mechanism configured, when the fixing apparatus is moved to a first position, to couple to an aperture disposed in the shelf so as to fix the board in the shelf after the board is installed into the shelf and, when moved to a second position, to couple to a limiter hole disposed in the main body, the limiter hole configured to limit movement of the fixing apparatus;

wherein the front panel of the board comprises a first fixing apparatus and a second fixing apparatus, wherein the first fixing apparatus proximate one end of the main body, and the second fixing apparatus is proximate another end of the main body;

wherein the fixing apparatus comprises a sliding base and a sliding plate, and the coupling mechanism comprises a screw, wherein the sliding base is connected to the main body of the front panel such that the sliding plate is movable in a space between the sliding base and the sliding plate; the sliding plate including a locating apparatus proximate a first end of the sliding plate and a limiter hole proximate a second end of the sliding plate; and the screw passes through the limiter hole in the sliding plate and is disposed in the limiter hole in the sliding plate, and is configured to connect to the aperture in the shelf when the sliding plate is moved to the first position, and wherein the locating apparatus is a locating screw, wherein the locating screw passes through and is disposed in a through hole that is on the sliding plate; wherein the limiter hole disposed in the main body is configured to perform limiting by inserting the locating screw into the limiter hole disposed in the main body when the locating screw is not inserted into the aperture and connected to the shelf.

17. An electronic apparatus, comprising:
a shelf;
a board coupled to the shelf;
wherein the board comprises a circuit board and a front panel, the front panel configured to connect to the circuit board, the board further comprising a fixing apparatus, wherein the fixing apparatus is connected to a main body of the front panel, the fixing apparatus including a coupling mechanism configured, when the fixing apparatus is moved to a first position, to couple to an aperture disposed in the shelf so as to fix the board in the shelf after the board is installed into the shelf and, when moved to a second position, to couple to a limiter hole disposed in the main body, the limiter hole configured to limit movement of the fixing apparatus; and wherein the front panel comprises a first fixing apparatus and a second fixing apparatus, wherein the first fixing apparatus is proximate one end of the main body and the second fixing apparatus is proximate another end of the main body;

wherein the fixing apparatus comprises a fixing base and a flipping plate, and the coupling mechanism comprises a screw, wherein the fixing base is connected to the main body of the front panel;

the flipping plate is articulated with the fixing base proximate a first end of the flipping plate, and the flipping plate has a limiter hole proximate a second end of the flipping plate; and the screw passes through the limiter hole in the flipping plate and is disposed in the limiter hole in the flipping plate, and is configured to connect to the aperture in the shelf when the fixing plate is moved to the first position, and wherein the limiter hole disposed in the main body is configured to perform limiting by inserting the screw into the limiter hole disposed in the main body when the screw is not inserted in the aperture and connected to the shelf.

18. An electronic apparatus, comprising:
a shelf;
a board coupled to the shelf;
wherein the board comprises a circuit board and a front panel, the front panel configured to connect to the circuit board, the board further comprising a fixing apparatus, wherein the fixing apparatus is connected to a main body of the front panel, the fixing apparatus including a coupling mechanism configured, when the fixing apparatus is moved to a first position, to couple to an aperture disposed in the shelf so as to fix the board in the shelf after the board is installed into the shelf and, when moved to a second position, to couple to a limiter hole disposed in the main body, the limiter hole configured to limit movement of the fixing apparatus; and wherein the front panel comprises a first fixing apparatus and a second fixing apparatus, wherein the first fixing apparatus is proximate one end of the main body and the second fixing apparatus is proximate another end of the main body;

wherein the fixing apparatus comprises a sliding base and a sliding plate, and the coupling mechanism comprises a screw, wherein the sliding base is connected to the main body of the front panel such that the sliding plate is movable in a space between the sliding base and the sliding plate; the sliding plate including a locating apparatus proximate a first end of the sliding plate and a limiter hole proximate a second end of the sliding plate; and the screw passes through the limiter hole in the sliding plate and is disposed in the limiter hole in the sliding plate, and is configured to connect to the aperture in the shelf when the sliding plate is moved to the first position, and wherein the locating apparatus is a locating screw, wherein the locating screw passes through and is disposed in a through hole that is on the sliding plate; wherein the limiter hole disposed in the main body is configured to perform limiting by inserting the locating screw into the limiter hole disposed in the main body when the locating screw is not inserted into the aperture and connected to the shelf.

* * * * *